(12) United States Patent
Wang et al.

(10) Patent No.: US 7,433,196 B1
(45) Date of Patent: Oct. 7, 2008

(54) CARD-TYPE ELECTRONIC APPARATUS ASSEMBLY USING ULTRASONIC JOINING

(75) Inventors: Kuang-Yu Wang, Saratoga, CA (US); Paul Hsueh, Concord, CA (US); Jim Ni, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 464 days.

(21) Appl. No.: 10/825,713

(22) Filed: Apr. 14, 2004

(51) Int. Cl.
*H05K 5/00* (2006.01)
(52) U.S. Cl. ........................ 361/752; 361/800
(58) Field of Classification Search ............ 361/732, 361/737, 752; 312/223
See application file for complete search history.

(56) References Cited

U.S. PATENT DOCUMENTS

| | | | |
|---|---|---|---|
| 5,339,222 A * | 8/1994 | Simmons et al. ........... 361/818 |
| 5,455,785 A | 10/1995 | Nazari | |
| 5,461,256 A * | 10/1995 | Yamada et al. ............. 257/679 |
| 5,505,628 A * | 4/1996 | Ramey et al. .............. 439/76.1 |
| 5,563,769 A | 10/1996 | MacGregor | |
| 5,574,628 A * | 11/1996 | Persia et al. ............... 361/737 |
| 5,891,483 A | 4/1999 | Miyajima | |
| 6,040,622 A | 3/2000 | Wallace | |
| 6,102,743 A | 8/2000 | Haffenden et al. | |
| 6,166,913 A | 12/2000 | Fun et al. | |
| D445,096 S | 7/2001 | Wallace | |
| D452,690 S | 1/2002 | Wallace et al. | |
| D452,865 S | 1/2002 | Wallace et al. | |
| D453,934 S | 2/2002 | Wallace et al. | |
| 6,381,143 B1 | 4/2002 | Nakamura | |
| 6,399,906 B1 | 6/2002 | Sato et al. | |
| 6,407,925 B1 * | 6/2002 | Kobayashi et al. ......... 361/752 |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,632,997 B2 * | 10/2003 | Hoffman et al. ............ 174/527 |
| 6,634,561 B1 | 10/2003 | Wallace | |
| 6,686,663 B2 * | 2/2004 | Masuda et al. ............. 257/777 |
| 6,692,268 B2 * | 2/2004 | Kung et al. ................ 439/76.1 |
| 6,947,288 B2 * | 9/2005 | Simmons et al. ........... 361/737 |
| 7,011,251 B1 * | 3/2006 | Miks et al. ................. 235/487 |

* cited by examiner

*Primary Examiner*—Hung S Bui
(74) *Attorney, Agent, or Firm*—Bever, Hoffman & Harms, LLP; Patrick T. Bever (57) ABSTRACT

A card-type electronic apparatus such as an SD card, a CF card, a Memory Stick card, or a USB flash drive is formed from an upper and lower cover that are bonded together at an interior seam formed using ultrasonic joining. Lower sidewalls on the lower cover create an installation pocket for the upper cover. The installation pocket not only simplifies alignment between the upper and lower covers, but also contains any bonder material overflow that might otherwise affect the external dimensions of the apparatus housing. The lower sidewalls can completely surround the upper cover, for drop in installation. Alternatively, the lower sidewalls can partially surround the upper cover, so that the upper cover can be slid into place during assembly.

26 Claims, 11 Drawing Sheets

CARD-TYPE ELECTRONIC APPARATUS ASSEMBLY USING ULTRASONIC JOINING

BACKGROUND OF THE INVENTION

1. Field of the Invention

The invention relates to the field of electronic devices, and in particular, to a method and structure for accurately and neatly assembling a card-type electronic apparatus.

2. Related Art

A card-type electronic apparatus (such as a flash memory card or a PCMCIA card) is a computer component that can be used, for example, as a storage element, a communications interface, or an authentication device. A card-type electronic apparatus typically includes a small printed circuit board assembly (PCBA) encased in a durable housing. The PCBA can include various types of integrated circuits (ICs), such as flash memory or communications controllers.

The form factors of the different card-type electronic apparatus housings are typically defined by a formal specification that provides detailed size, shape, and connectivity requirements. Card-type electronic apparatus housings must therefore be carefully controlled to ensure compatibility with related products.

A card-type electronic apparatus is typically formed in a sandwich fashion, with two rigid plastic device covers enclosing the PCBA. Typically, those plastic covers are ultrasonically welded together, thereby ensuring a permanent encapsulation of the PCBA.

Figure 1A:
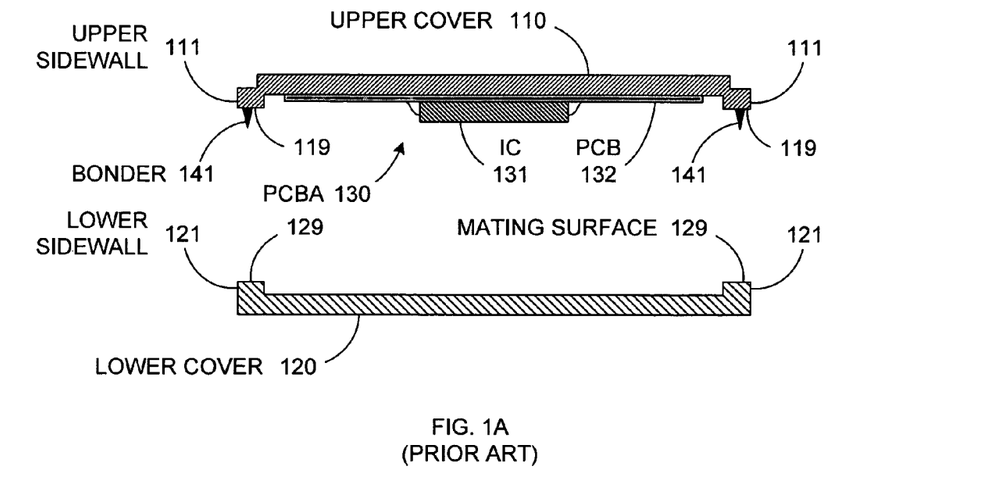
FIGS. 1A and 1B are a cross-sectional view of conventional SD card components being assembled into an SD card.
Figure 1B:
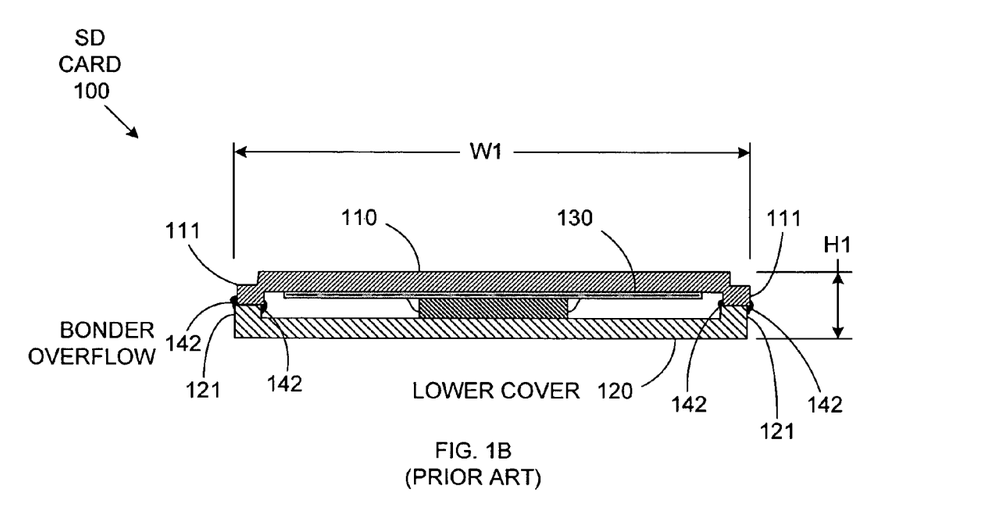

FIGS. 1A and 1B depict a conventional assembly process for a standard Secure Digital (SD) card 100. This process is similar to that described in U.S. Pat. No. 6,381,143, issued to Nakamura on Apr. 30, 2002. In FIG. 1A, an upper cover 110 is positioned above a lower cover 120. A PCBA 130 (that includes an IC 131 mounted on a PCB 132) is affixed to upper cover 110. PCBA 130 includes an IC 131 mounted on a printed circuit board (PCB) 132.

Upper cover 110 includes upper sidewalls 111 that run along the perimeter of upper cover 110. Multiple ultrasonic bonders 141 are mounted on mating surfaces 119 of upper sidewalls 111. Upper sidewalls 111 are sized and positioned such that mating surfaces 119 match up with corresponding mating surfaces 129 on lower sidewalls 121 that run along the perimeter of lower cover 120. Ideally, when upper sidewalls 111 and lower sidewalls 121 are clamped together and ultrasonic vibrations are applied to bonders 141, upper cover 110 and lower cover 120 are permanently joined to form a rigid enclosure for PCBA 130, as shown in FIG. 1B.

Unfortunately, the SD card 100 formed using conventional upper cover 110 and lower cover 120 can exhibit problematic deviations from the optimal SD card form factor. For example, because upper sidewalls 111 and lower sidewalls 121 must be aligned using a die (jig) or some other external alignment mechanism, misalignment can occur between upper cover 110 and lower cover 120. This misalignment can increase the overall width W1 of SD card 100 and cause SD card 100 to not fit properly into all SD card sockets.

Furthermore, because the height Hi of SD card 100 is determined by the combined heights of upper sidewalls 111 and lower sidewalls 121 (and any residual bonding material between the two), accurately achieving a specific value for height Hi can be difficult. In addition, the flow of bonders 141 as they melt during the ultrasonic joining process can cause form factor problems. Because joining occurs at an external seam of SD card 100 (i.e., mating surfaces 119 and 129 form a joint on the exterior of SD card 100), bonder overflow 142 can reach the exterior of SD card 100. This bonder overflow 142 can then harden, and like misalignment between upper cover 110 and lower cover 120, can cause fit problems for SD card 100.

What is needed is a card-type electronic apparatus housing that ensures good form factor integrity.

SUMMARY OF THE INVENTION

The present invention is directed to a card-type electronic apparatus that is formed from upper and lower covers that are joined at a seam that is internal to the apparatus housing. This internal joining beneficially prevents bonding material from overflowing to the exterior of the apparatus, and also minimizes the chances of misalignment between the upper and lower covers (and at the same time eliminating the need for high-precision alignment tooling for assembly). The invention can be applied to any card-type electronic apparatus, including Secure Digital (SD) cards, CompactFlash (CF) cards, Memory Stick cards, and USB flash drives, among others.

According to an embodiment of the invention, a card-type electronic apparatus includes an upper cover and a lower cover that enclose a PCBA. The lower cover includes two or more sidewalls that define an internal region ("pocket") within the lower cover that is sized to accept corresponding portions of the upper cover. The upper cover is placed into this pocket region, where it is bonded to the lower cover.

Bonding between the upper cover and lower cover takes place within this pocket region, so that the sidewalls of the lower cover beneficially prevent melted bonding material from flowing to the exterior of the apparatus. In addition, since the sides of the card-type electronic apparatus can be formed from just the sidewalls of the lower cover (rather than from a combination of sidewalls from both the upper and lower covers), control over the dimensional integrity of the apparatus can be more easily maintained.

According to an embodiment of the invention, the sidewalls of the lower cover can be a slip fit with the upper cover, thereby simple assembly and re-assembly prior to ultrasonic bonding. According to another embodiment of the invention, the sidewalls of the lower cover can be an interference fit with the upper cover, thereby providing improved bonding between the upper and lower covers for enhanced durability.

According to an embodiment of the invention, the sidewalls of the lower cover completely surround the upper cover, thereby providing total positioning and alignment of the upper cover relative to the lower cover. According to another embodiment of the invention, the sidewalls of the lower cover only partially surround the upper cover, thereby enabling greater assembly flexibility.

The invention will be more fully understood in view of the following description of the exemplary embodiments and the drawings thereof.

DETAILED DESCRIPTION

Figure 2A:
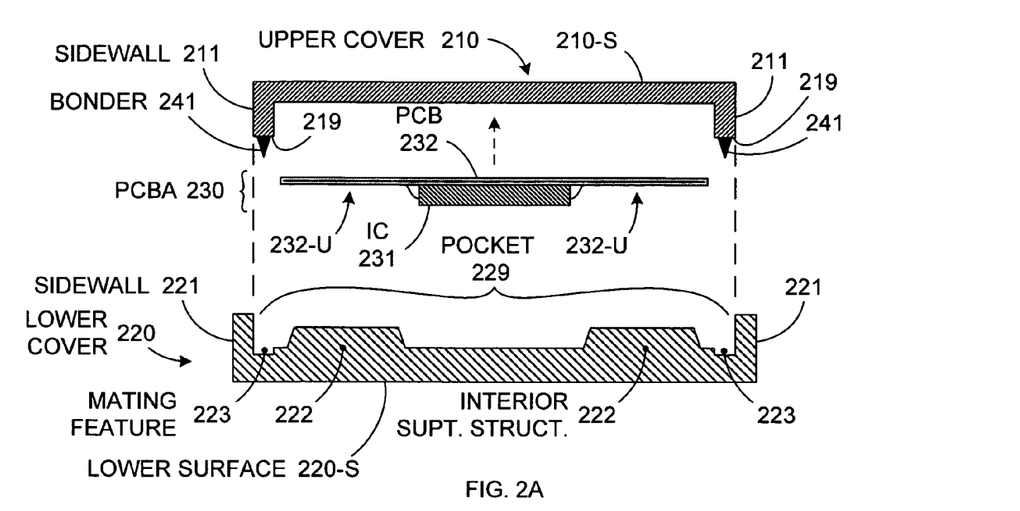
FIGS. 2A, 2B, and 2C are cross-sectional views of card-type electronic apparatus components according to an embodiment of the invention being assembled.
Figure 2B:
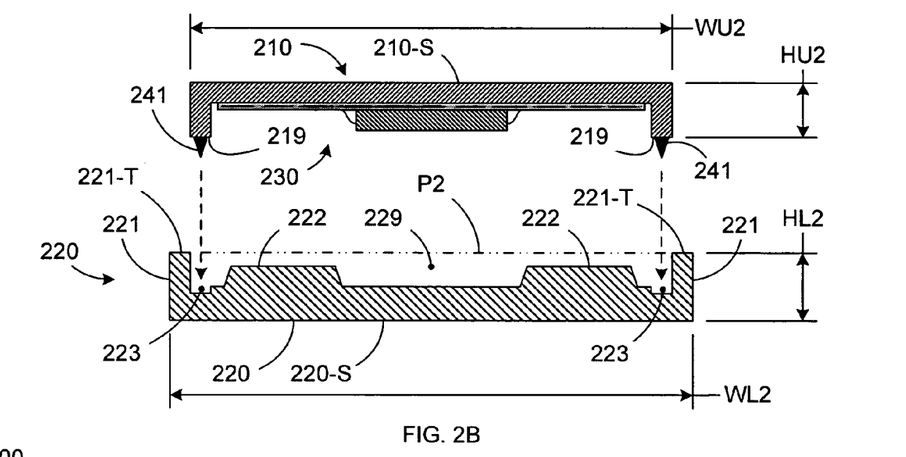
Figure 2C:
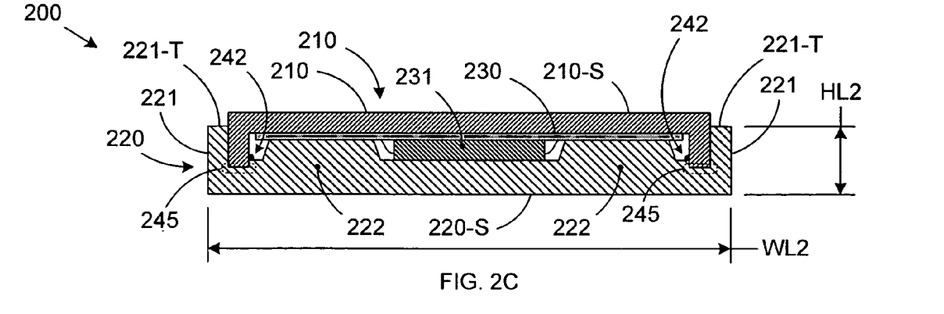

FIGS. 2A, 2B, and 2C show an assembly process for a card-type electronic apparatus, according to an embodiment of the invention. As depicted in FIG. 2A, the card-type electronic apparatus includes an upper cover 210, a lower cover 220, and a PCBA 230. PCBA 230 includes one or more ICs 231 and/or other electronic components mounted on a PCB 232. Upper cover 210 includes upper sidewalls 211 that extend substantially perpendicularly away from a substantially planar upper (external) surface 210-S of upper surface 210. Sidewalls 211 run along at least two edges of upper cover 210, and multiple ultrasonic bonders 241 are attached to various locations on mating surfaces 219 of sidewalls 211. Meanwhile, lower cover 220 includes lower sidewalls 221 that extend substantially perpendicularly from a substantially planar lower (external) surface 220-S of lower cover 220. Sidewalls 221 run along at least two edges of lower cover 220.

Unlike in conventional card-type device housings (such as depicted in FIGS. 1A-1B), lower sidewalls 221 are not designed to be directly attached to upper sidewalls 211. Instead, lower sidewalls 221 are sized and positioned to define a pocket 229 that is larger than the outer dimension of upper sidewalls 211 (i.e., the external surface-to-external surface distance WU2 between sidewalls 211). Meanwhile, lower cover 220 also includes mating features 223 that are inboard of sidewalls 221 (i.e., are within pocket 229).

According to an embodiment of the invention, the bottom of pocket 229 can include various interior support structures 222. As is described in greater detail below, interior support structures 222 can improve the structural rigidity and durability of the final assembled device.

In FIG. 2B, PCBA 230 is mounted on upper cover 210, between sidewalls 211. However, note that according to various other embodiments of the invention, PCBA 230 could be attached to lower cover 220. According to various other embodiments of the invention, PCBA 230 separate from both upper cover 210 and lower cover 220, in which case PCBA 230 would be held in place by the assembly of covers 210 and 220.

To complete the assembly process, upper cover 210 is inserted into pocket 229 (with bonders 241 being pressed into receiving features 223), and a compressive (clamping) load is applied to force upper cover 210 towards lower cover 220 while ultrasonic vibrations are applied to bonders 241. The ultrasonic vibrations cause bonders 241 to melt, thereby joining upper cover 210 with lower cover 220 to form the final card-type electronic apparatus 200, as shown in FIG. 2C. Card-type electronic apparatus 200 can be any type of card-type electronic apparatus, including an SD card, a CF card, a Memory Stick card, a USB flash drive, or a flash memory hard drive, among others.

Because upper cover 210 "fits into" lower cover 220, the external form factor of apparatus 200 can be controlled to a large degree by lower sidewalls 221. As shown in FIG. 2C, the width WL2 of card-type electronic apparatus 200 is defined by the external surfaces of sidewalls 221 of lower cover 220. Lower cover 220 can similarly define the length of card-type electronic apparatus 200. Note also that while the top surface 210-S of upper cover 210 is positioned above the plane P2 (shown in FIG. 2B) defined by the top surfaces 221-T of lower sidewalls 221 for exemplary purposes, according to another embodiment of the invention, top surface 210-S could be positioned at or below plane P2.

Figure 2D:
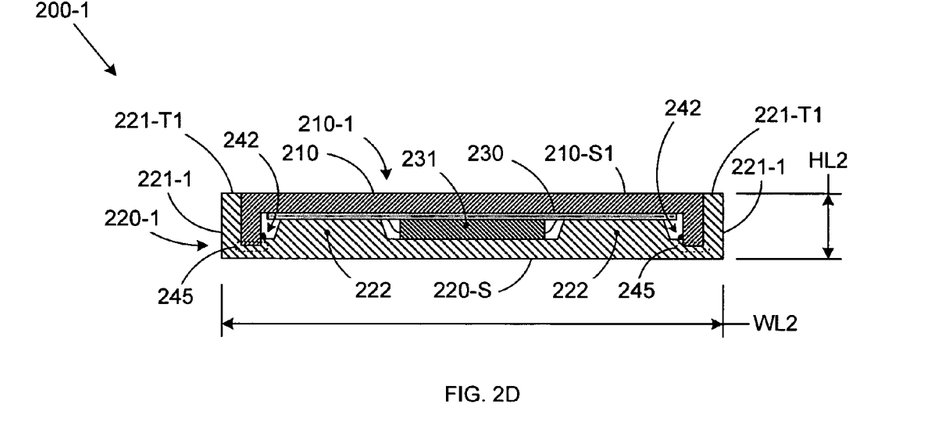
FIG. 2D is a cross-sectional view of a card-type electronic apparatus according to another embodiment of the invention.

For example, FIG. 2D shows a card-type electronic apparatus 200-1 that is substantially similar to card-type electronic apparatus 200 of FIG. 2C, except that the top surface 210-S1 of upper cover 210-1 is at the same level as (i.e., coplanar with) the top surfaces 221-T1 of lower sidewalls 221-1 of lower cover 220-1. Therefore, the height of card-type electronic apparatus 200-1 is determined by the height HL2 of lower sidewalls 221-1.

Another benefit provided by the mating features 223 of lower cover 220 being inboard of sidewalls 221 is that sidewalls 221 can provide alignment of upper cover 210 as it is being inserted into pocket 229. Consequently, the assembly of card-type electronic apparatus 200 is greatly simplified over the assembly of conventional card-type electronic apparatus 100 shown in FIGS. 1A-1B.

According to an embodiment of the invention, pocket 229 can have a slip fit interface with upper sidewalls 211, so that upper cover 210 can be easily placed into lower cover 220 prior to the ultrasonic joining operation. According to another embodiment of the invention, pocket 229 can provide an interference fit with sidewalls 211, thereby providing additional joint strength when apparatus 200 is fully assembled.

Note that because the actual bonding between upper cover 210 and lower cover 220 is performed at an interior seam 245 (i.e., a joint inboard of sidewalls 221), any bonder overflow 242 is contained within apparatus 200, thereby preventing the overflow material from causing (external) dimensional problems. Optional receiving features 223 can further minimize the possibility of external bonding material overflow by providing specific regions into which bonder overflow 242 can flow.

Note further that, as indicated in FIG. 2C, optional support structure 222 can improve the strength and durability of apparatus 200 by providing an interface contour that is similar to that of PCBA 230. In particular, the raised support structures 222 meet the unpopulated regions of PCBA 230 (i.e., the portions of PCBA 230 that do not include components such as IC 231, such as regions 232-U indicated in FIG. 2A), thereby minimizing the possibility of crush-type damage to IC 231.

Figure 3A:
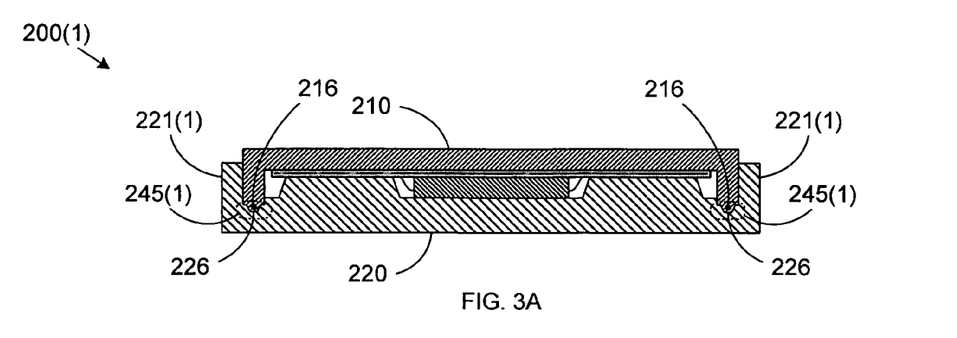
FIGS. 3A, 3B, and 3C are cross sectional views of card-type electronic apparatus having various sidewall configurations, in accordance with various embodiments of the invention.

Note also that while the sidewalls 211 and 221 are depicted as having simple rectangular cross sections for exemplary purposes, any sidewall (and mating surface/feature) profile can be used that allows an internal seam to be formed. For example, FIG. 3A shows a card-type electronic apparatus 200(1) that is substantially similar to electronic apparatus 200 shown in FIG. 2C, except that the mating surfaces of the upper sidewalls of upper cover 210 include a "tongue" feature 216 that mates with a "groove" feature 226 in lower cover 220 to form an interior seam 245(1). This tongue and groove interface can improve the strength of the bond between upper cover 210 and lower cover 220.

Figure 3B:
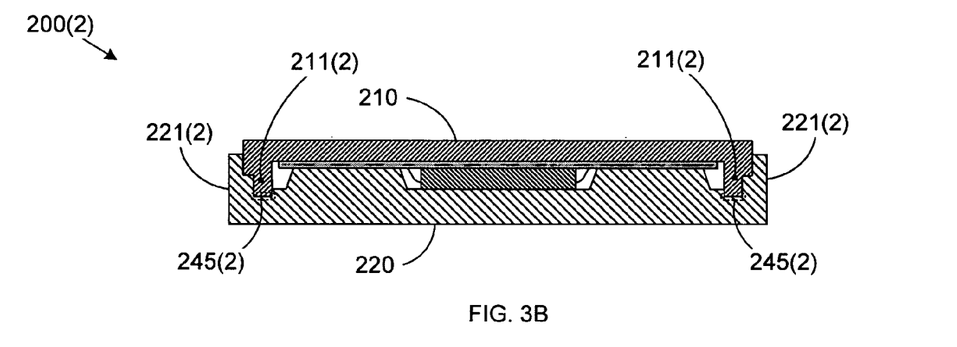

FIG. 3B shows a card-type electronic apparatus 200(2) that is substantially similar to card-type electronic apparatus 200 shown in FIG. 2C, except that upper sidewalls 211(2) include "step" features that mate with lower sidewalls 221(2). Note, however, that an interior seam 245(2) can still be formed, since the top "steps" of upper sidewalls 211(2) extend into the pocket defined by lower sidewalls 221(2).

Figure 3C:
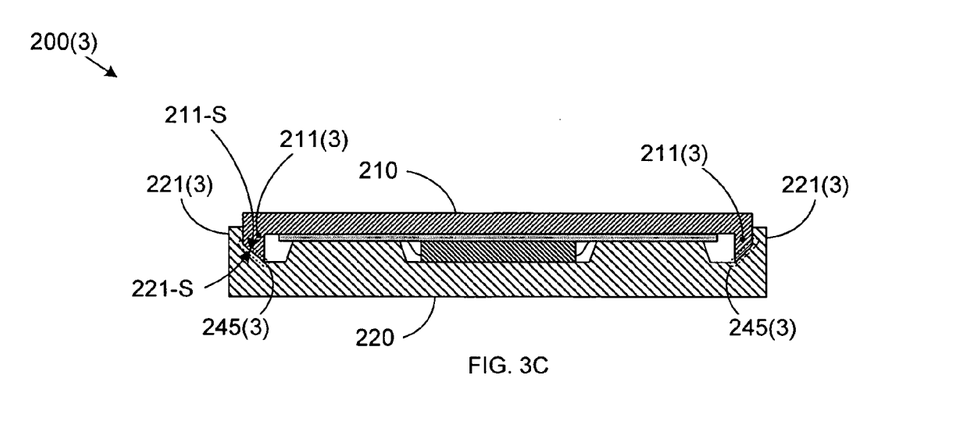

FIG. 3C shows a card-type electronic apparatus 200(3) that is substantially similar to card-type electronic apparatus 200 shown in FIG. 2C, except that upper sidewalls 211(3) and lower sidewalls 221(3) include inclined mating surfaces 211-S and 221-S, respectively. Inclined mating surface 211-S slopes away from upper cover 210 (i.e., the slope of surface 211-S diverges from upper cover 210), while inclined mating surface 221-S slopes towards lower cover 220 (i.e., the slope of surface 221-S intersects lower cover 220). Therefore, inclined mating surfaces 211-S and 221-S provide self-alignment capability between upper cover 210 and lower cover 220, while still allowing an interior seam 245(3) to be formed (inboard of lower sidewalls 221(3)). Note that the sidewall configurations shown in FIGS. 3A and 3B can also provide self-alignment capabilities, but to a lesser degree than the inclined mating surfaces 211-S and 221-S in FIG. 3C.

Figure 4:
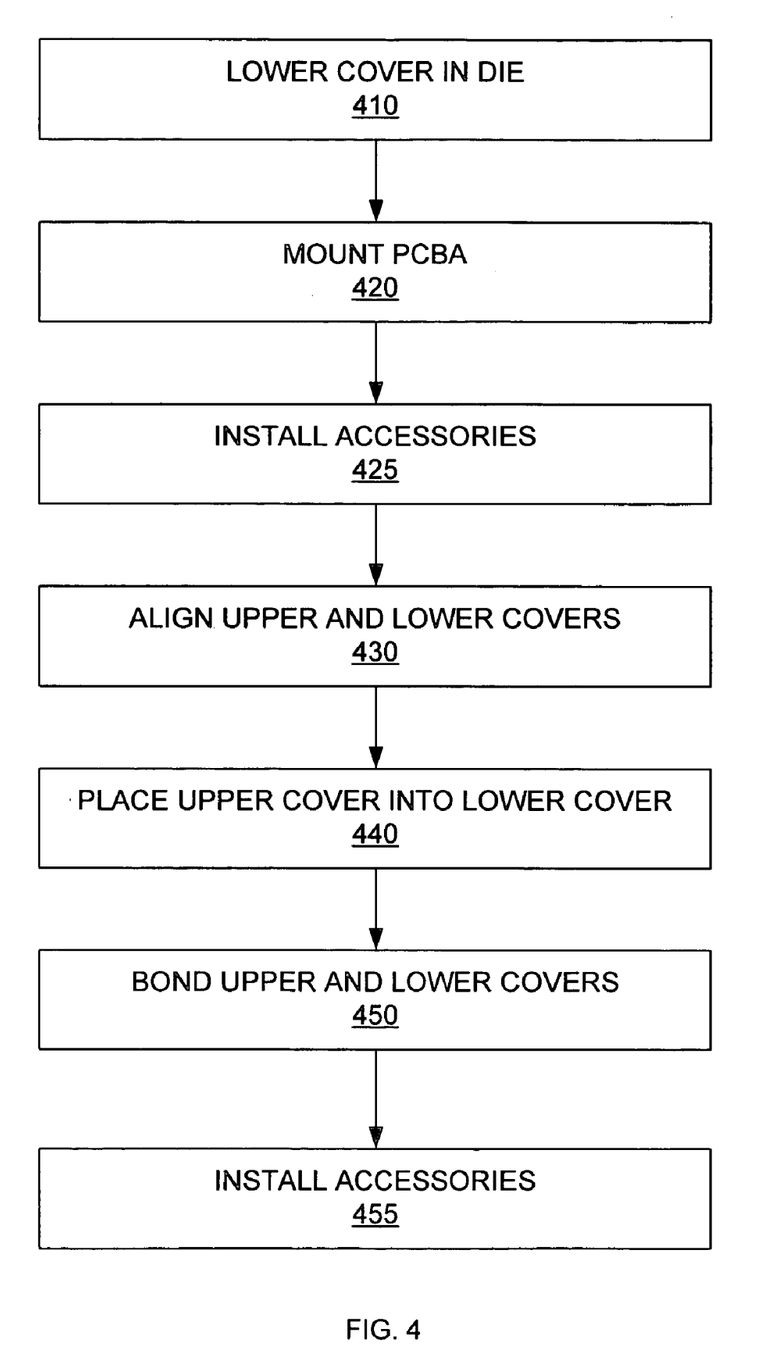
FIG. 4 is a flow diagram of a card-type electronic apparatus assembly procedure in accordance with an embodiment of the invention.

FIG. 4 shows a flow diagram for a card-type electronic apparatus that is substantially similar to the assembly procedure shown in FIGS. 2A-2C, according to an embodiment of the invention. In a "LOWER COVER IN DIE" step 410, the lower cover (220) is placed in an assembly die or jig. Then, in a "MOUNT PCBA" step 420, the PCBA (240) is attached to the upper cover (210). Once the PCBA has been mounted, accessories such as switches or LED indicators can be installed in an optional "INSTALL ACCESSORIES" step 425.

Next, in an "ALIGN UPPER AND LOWER COVERS" step 430, the upper and lower covers are placed in a position relative to one another that is appropriate for the assembly procedure being used. For example, if the sidewalls (221) of the lower cover form a pocket (229) that completely surrounds the mating features (223) in the lower cover, then the upper cover would be positioned directly above (i.e., facing) the lower cover. However, if the sidewalls of the lower cover form a pocket that only partially surrounds the mating features, the upper cover could be positioned beside the lower cover to allow the upper cover to be "slid" in to the pocket (as described in greater detail below with respect to FIGS. 6 and 7A-7C).

After step 430, the upper cover is placed into the pocket formed by the sidewalls of the lower cover in a "PLACE UPPER COVER INTO LOWER COVER" step 440. Finally, a clamping load and ultrasonic vibrations are applied to join the upper and lower covers in a "BOND UPPER AND LOWER COVERS" step 450. If necessary, accessories such as switches can be installed in an optional "INSTALL ACCESSORIES" step 455 to complete the assembly of the card-type electronic apparatus (200).

Figure 5A:
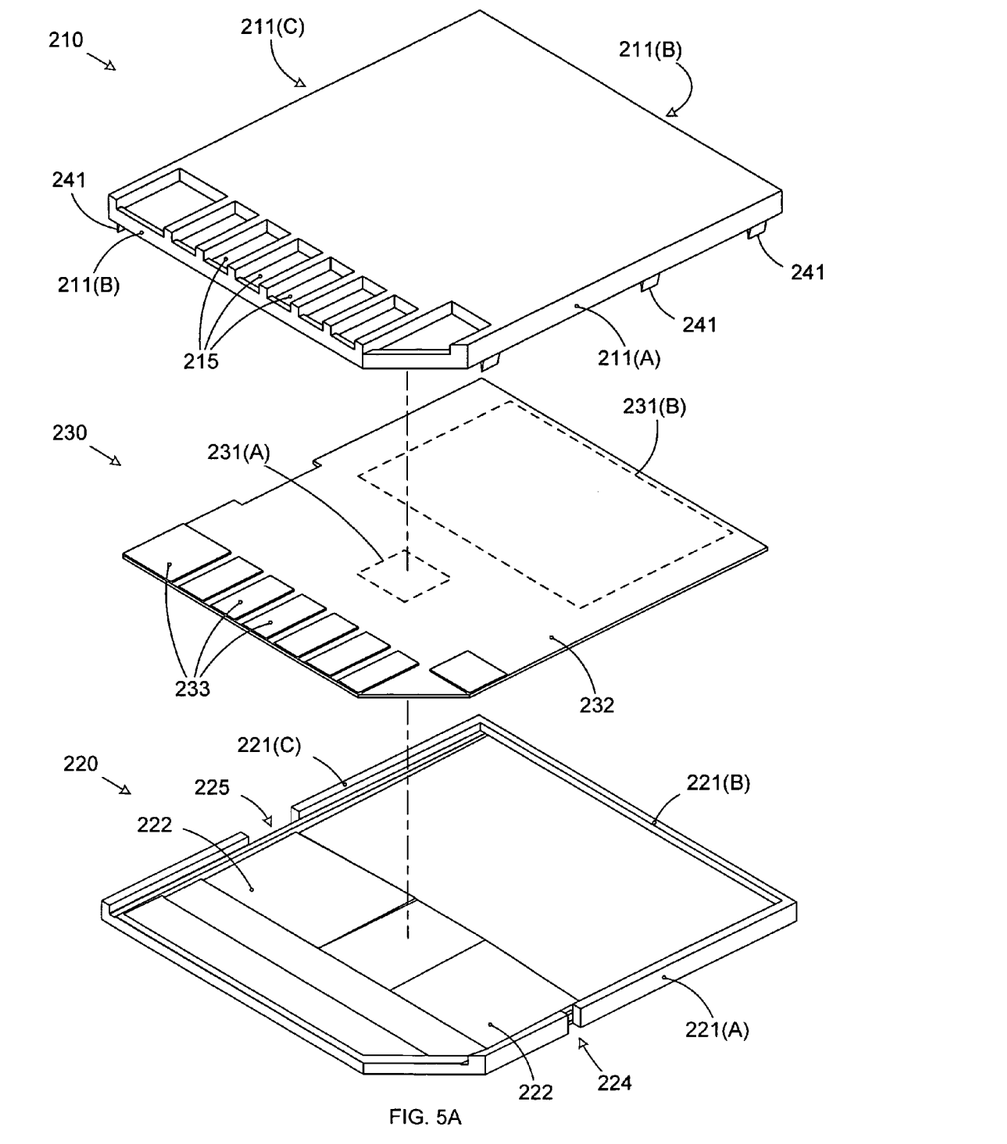
FIG. 5A is a partial exploded isometric view of a card-type electronic apparatus in accordance with an embodiment of the invention.

FIG. 5A shows a partially exploded isometric view of the card-type electronic apparatus 200 shown in FIG. 2C, in accordance with an embodiment of the invention. An upper cover 210 includes upper sidewalls 211(A), 211(B), and 211(C), which run along three edges of upper cover 210, and a plurality of contact slots 215. Multiple ultrasonic bonders 241 are attached to the mating surfaces of upper sidewalls 211(A)-211(C).

A PCBA 230 is sized to fit into the region of upper cover 210 defined by upper sidewalls 211(A)-211(C). PCBA 230 includes ICs 231(A) and 231(B) and contacts 233, which are all mounted on (the reverse side of) a PCB 232. When PCBA 230 is mounted in upper cover 210, access to contacts 233 is provided via contact slots 215.

Finally, a lower cover 220 includes lower sidewalls 221(A), 221(B), and 221(C), which run along three edges of lower cover 220, and multiple internal support structures 222 in the region of lower cover 220 defined by sidewalls 221(A)-221(C). Lower sidewalls 221(A)-221(C) are sized and positioned such that upper sidewalls 211(A)-211(C) fit within the region defined by lower sidewalls 221(A)-221(C).

Note that according to various embodiments of the invention, sidewalls need not be continuous structures. For example, lower sidewalls 221(A) and 221(C) can include optional gaps 224 and 225 that could be used as an interface feature and a switch opening, respectively.

Figure 5B:
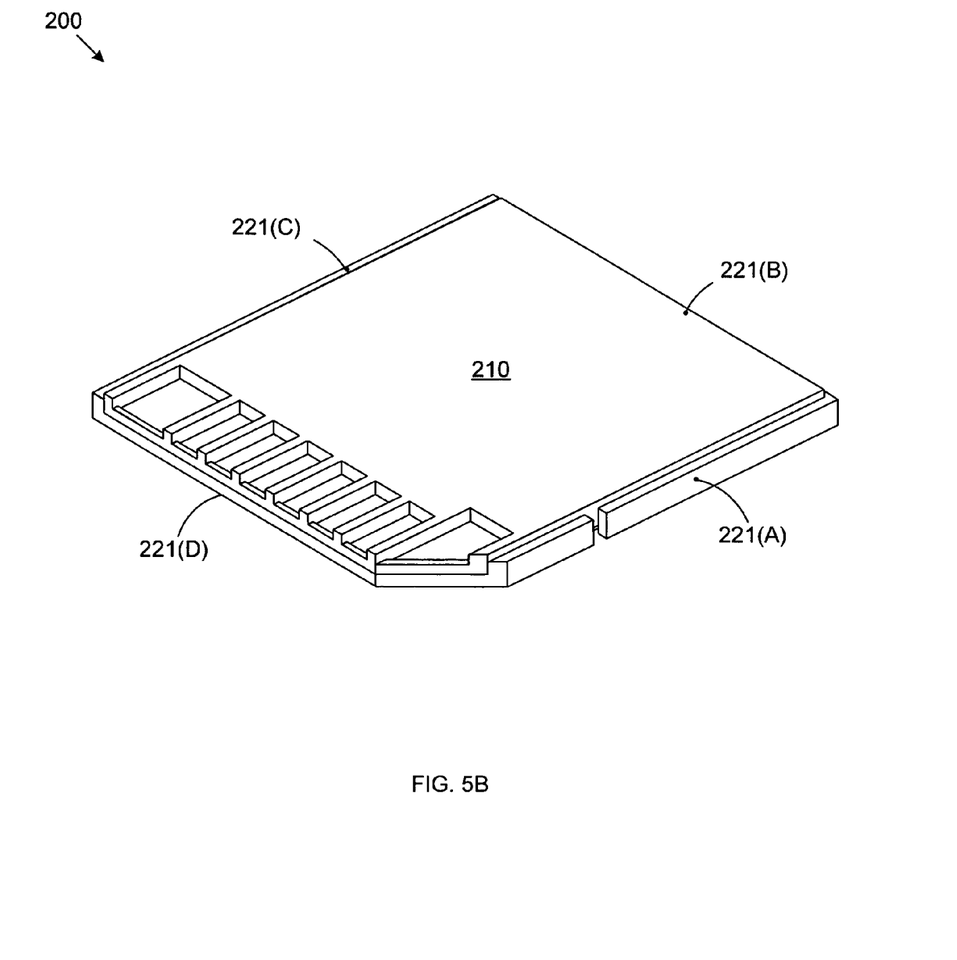
FIG. 5B is an isometric assembled view of the card-type electronic apparatus shown in FIG. 5A.

FIG. 5B shows an assembled isometric view of card-type electronic apparatus 200, which shows upper cover 210 within the region defined by lower sidewalls 221(A)-221(C). Note that while three lower sidewalls on three edges of lower cover 220 are depicted for exemplary purposes, according to various other embodiments of the invention, lower cover 220 could include more or fewer sidewalls 221.

Figure 6:
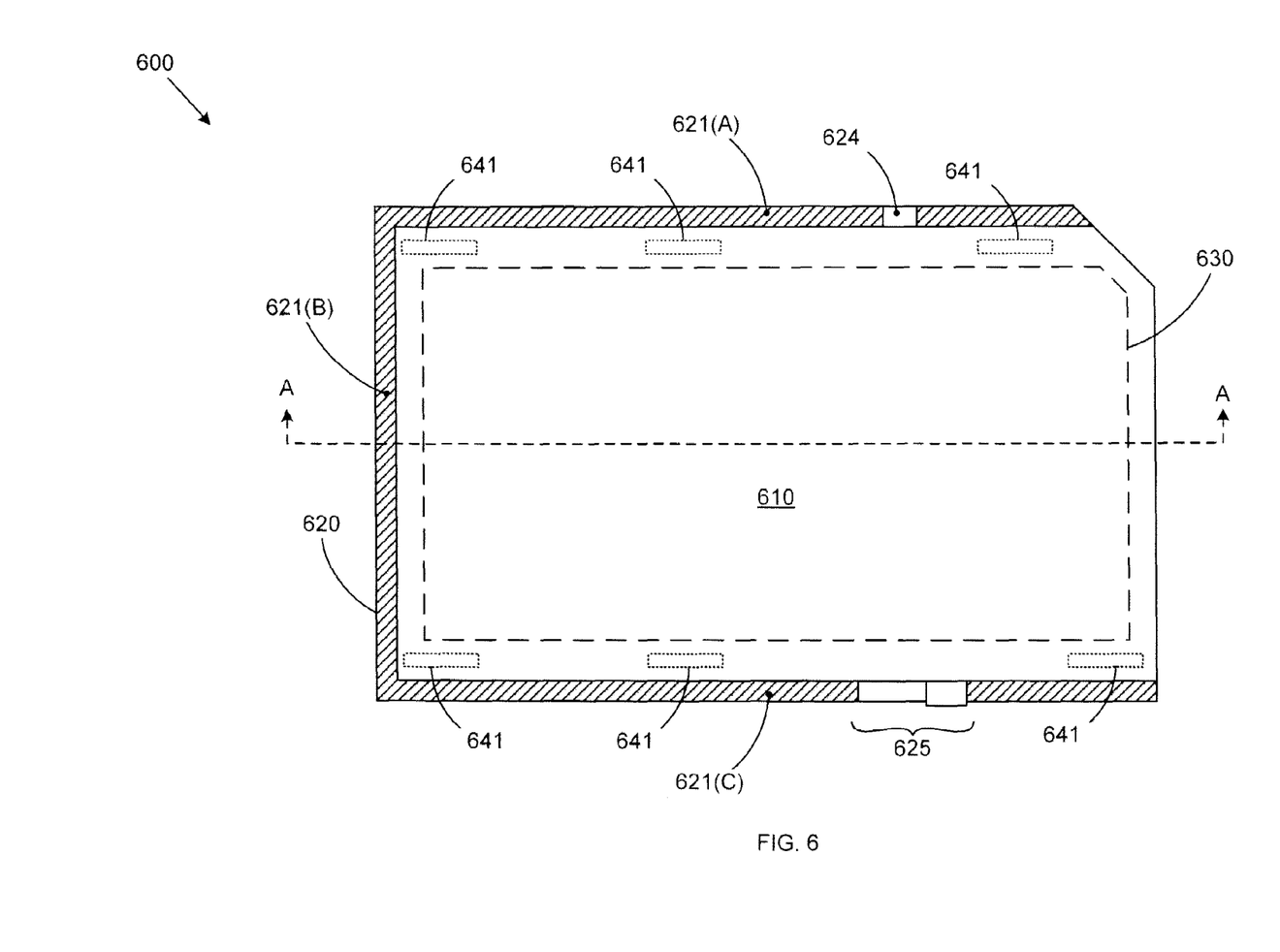
FIG. 6 is a top plan view of the assembled card-type electronic apparatus shown in FIG. 2C.

FIG. 6 shows a top view of a card-type electronic apparatus 600 according to an embodiment of the invention. Apparatus 600 includes an upper cover 610 that is bonded to a lower cover 620 (the location of enclosed PCBA 630 and possible locations for bonders 641 are depicted for exemplary purposes). Like lower cover 520 shown in FIGS. 5A and 5B, lower cover 620 includes three lower sidewalls 621(A), 621(B), and 621(C), which bound upper cover 610 on three sides. Optional interface feature 624 and switch opening 625 are shown in lower sidewalls 621(A) and 621(C), respectively, for reference purposes.

Because upper cover 610 is only partially surrounded by lower sidewalls 621(A)-621(C), upper cover 610 need not be inserted into lower cover 620 in the vertical direction (i.e., the direction substantially perpendicular to the plane of covers 610 and 620). Instead, upper cover 610 can be slid into place in the horizontal direction (i.e., parallel to the plane of covers 610 and 620).

Figure 7A:
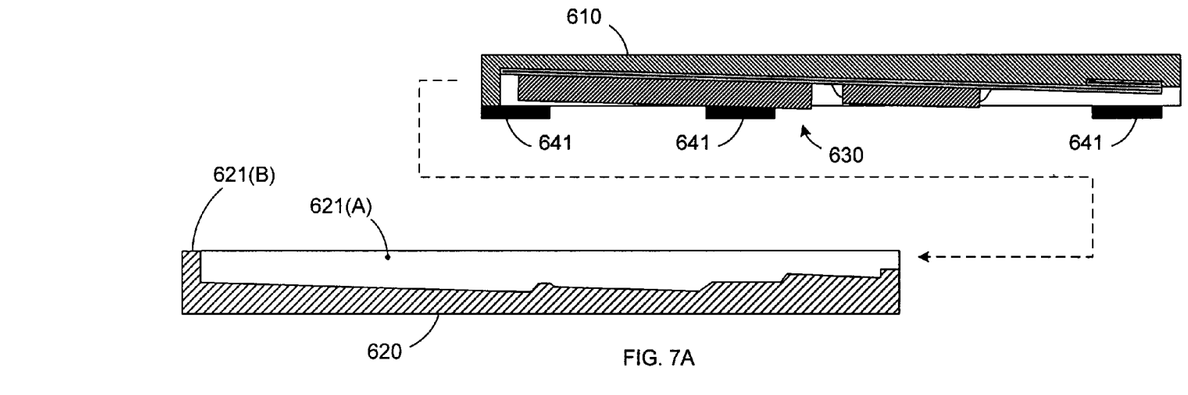
FIGS. 7A, 7B, and 7C are cross-sectional views of the card-type electronic apparatus of FIG. 6, showing an assembly procedure according to another embodiment of the invention being assembled.

For example, FIGS. 7A-7C show an assembly procedure for card-type electronic apparatus 600 (taken through cross-section AA in FIG. 6), according to an embodiment of the invention. Though not part of cross-section AA, ultrasonic bonders 641 and lower sidewall 621(A) are shown for reference. FIG. 7A depicts upper cover 610 (with PCBA 630 installed) separated from lower cover 620. As indicated by the dashed arrow, upper cover 610 is placed next to the unwalled edge of lower cover 620. Upper cover 610 can then be slid into place over lower cover 620, with lower sidewalls 621(A) and 621(C) (not shown) acting as guides. Lower sidewall 621(B) sets the end of travel for the slide operation.

Figure 7B:
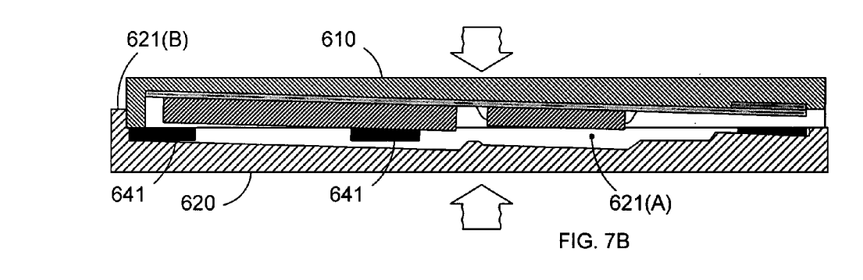
Figure 7C:
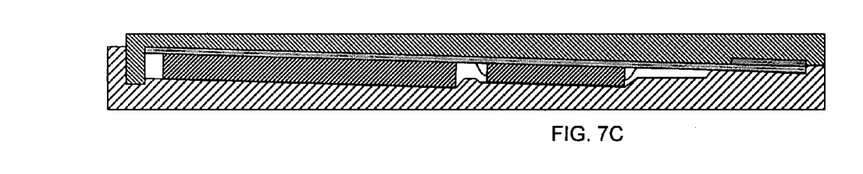

Once upper cover 610 is properly positioned over lower cover 620, as shown in FIG. 7B, a clamping force is applied to covers 610 and 620, and ultrasonic energy is applied to bonders 641, as indicated by the large arrows. Bonders 641 melt under those bonding conditions, thereby joining upper cover 610 and lower cover 620 to form card-type electronic apparatus 600.

Figure 8A:
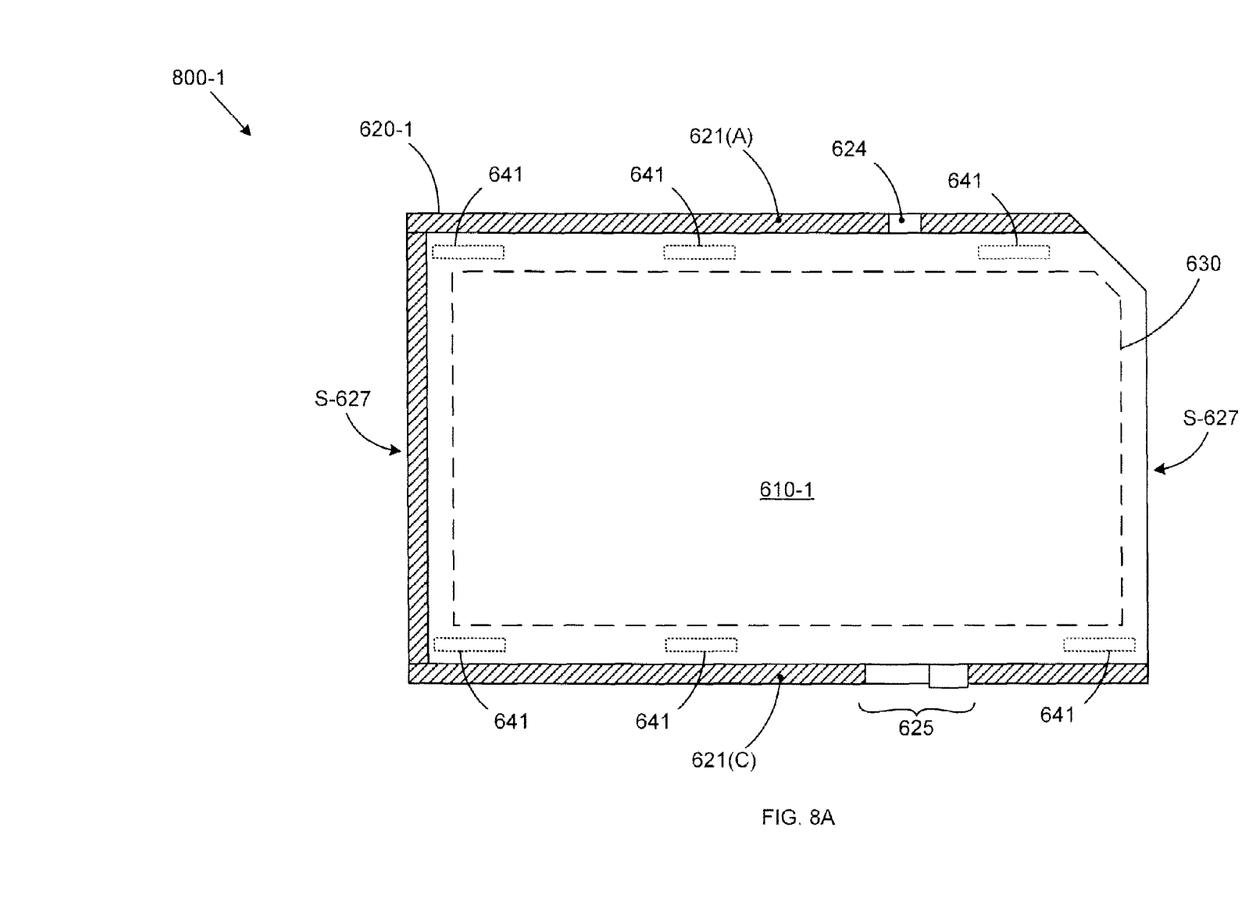
FIGS. 8A and 8B are top plan views of card-type electronic apparatus according to various other embodiments of the invention.

Note that according to another embodiment of the invention, lower sidewall 621(B) (in FIGS. 6 and 7C) can be removed, and some other means (e.g., external tooling, manual inspection) can be used to set the end position of upper cover 610 relative to lower cover 620. FIG. 8A shows a top view of a card-type electronic apparatus 800-1 that is substantially similar to card-type electronic apparatus 600 shown in FIGS. 6 and 7C, except that lower cover 620-1 includes only two sidewalls 621(A) and 621(C), and upper cover 610-1 extends all the way to the front and rear edges S-627 of lower cover 620-1.

Figure 8B:
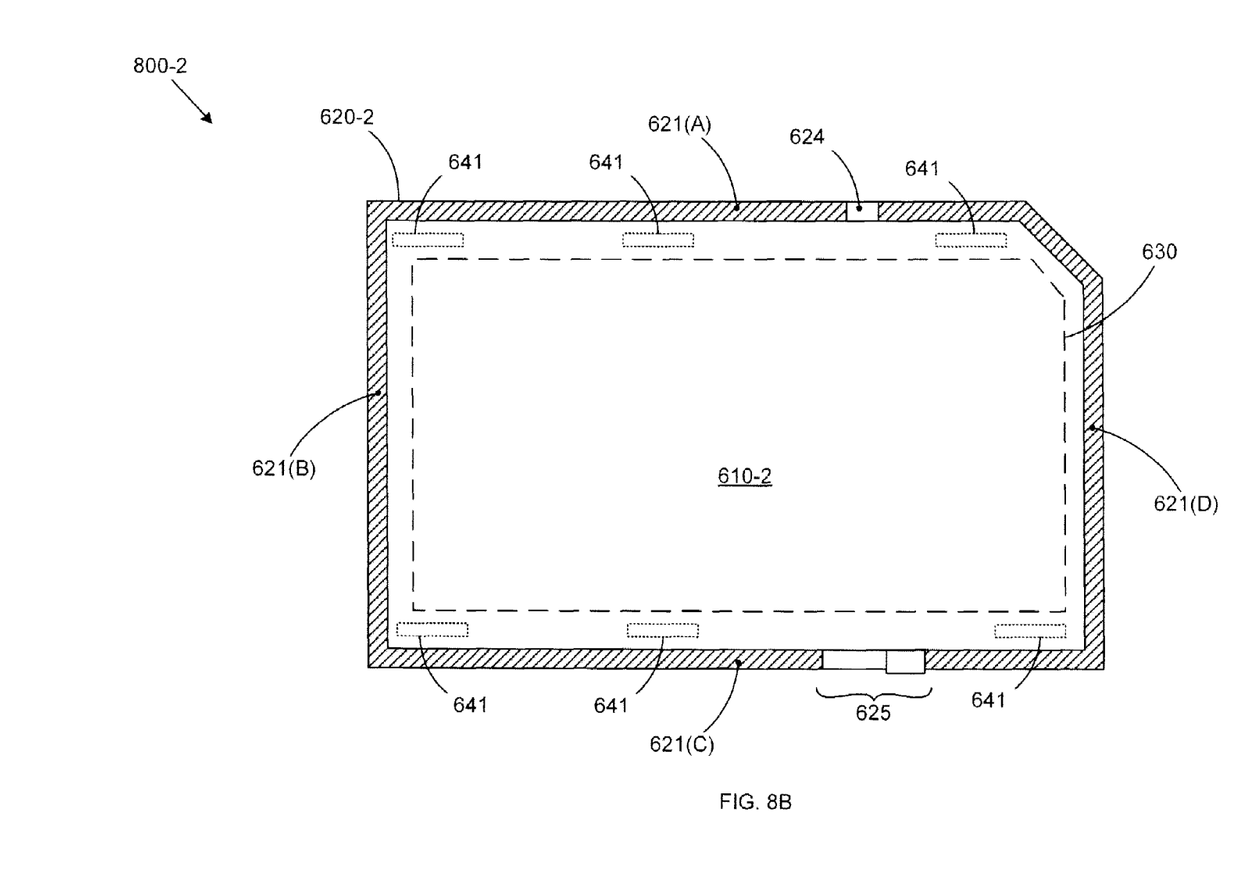

FIG. 8B shows a top view of a card-type electronic apparatus 800-2 according to another embodiment of the invention. Card-type electronic apparatus 800-2 is substantially similar to the card-type electronic apparatus 600 shown in FIGS. 6 and 7C, except that lower cover 620-2 of apparatus 800-2 includes sidewalls 621(A), 621(B), 621(C), and 621 (D) that run along the entire perimeter of lower cover 620-2. Sidewalls 621(A)-621(D) completely surround upper cover 610-2, thereby providing total alignment between upper cover 610-2 and lower cover 620-2. Note that a vertical assembly process would be required for card-type electronic apparatus 800-2 (i.e., upper cover 610-2 would be positioned above lower cover 620-2 and then lowered into the pocket formed by lower sidewalls 621(A)-621(D).

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A card-type electronic apparatus comprising:
 a printed circuit board assembly (PCBA) including one or more integrated circuits (ICs) mounted on a printed circuit board (PCB), the PCBA having a width defined by opposing side edges of the PCB;
 a plastic upper cover comprising a plurality of upper sidewalls extending substantially perpendicularly from a top exterior surface of the upper cover, each of the plurality of upper sidewalls including an upper mating feature disposed at lower ends thereof; and
 a plastic lower cover comprising a plurality of lower mating features and at least two lower sidewalls, the at least two lower sidewalls extending substantially perpendicularly from a bottom exterior surface of the lower cover, the plurality of lower mating features being inboard of the at least two lower sidewalls and disposed on an interior surface of said lower cover,
 wherein said lower sidewalls are separated by a width that is wider than an external surface-to-external surface distance of said upper sidewalls, whereby when said upper cover is mounted on said lower cover, both said upper sidewalls are disposed between said lower sidewalls with said upper mating features contacting lower mating features, and wherein when the plurality of upper mating features are subsequently ultrasonically welded to the plurality of lower mating features, the upper and lower mating features are melted together along an interior seam located at a base of said lower sidewalls,
 wherein the upper cover and the lower cover enclose the PCBA, and
 wherein the width of the PCBA is substantially equal to an interior width separating interior surfaces of the upper side walls, and the PCBA is mounted against an interior surface of the upper cover such that no portion of the lower cover is disposed between outer edges of the PCBA and the upper side walls of the upper cover.

2. The card-type electronic apparatus of claim 1, wherein the at least two lower sidewalls completely surround the upper cover.

3. The card-type electronic apparatus of claim 1, wherein the at least two lower sidewalls partially surround the upper cover.

4. The card-type electronic apparatus of claim 1, wherein the at least two lower sidewalls form a slip fit with the upper cover.

5. The card-type electronic apparatus of claim 1, wherein the at least two lower sidewalls form an interference fit with the upper cover.

6. The card-type electronic apparatus of claim 1, wherein the plurality of upper mating features include tongue elements, and
 wherein the plurality of lower mating features includes groove elements sized to accept the tongue elements.

7. The card-type electronic apparatus of claim 1, wherein the plurality of upper mating features includes at least one stair-step feature, and
 wherein the at least one stair-step feature is attached to one of the plurality of lower mating features.

8. The card-type electronic apparatus of claim 1, wherein the plurality of upper mating features includes a first inclined surface, the first inclined surface sloping away from the upper cover, and
 wherein the plurality of lower mating features includes a second inclined surface, the second inclined surface sloping towards the lower cover, and the second inclined surface being attached to the first inclined surface.

9. The card-type electronic apparatus of claim 1, wherein the lower cover comprises one or more support structures, the one or more support structures being in contact with one or more unpopulated regions on the PCB.

10. The card-type electronic apparatus of claim 1, wherein each of the at least two lower sidewalls includes a top surface, and
 wherein an upper external surface of the upper cover is above a plane defined by the top surfaces of each of the at least two lower sidewalls.

11. The card-type electronic apparatus of claim 1, wherein each of the at least two lower sidewalls includes a top surface, and
 wherein an upper external surface of the upper cover is at or below a plane defined by the top surfaces of each of the at least two lower sidewalls.

12. The card-type electronic apparatus of claim 1, wherein the card-type electronic apparatus comprises one of a Secure Digital (SD) card, a CompactFlash (CF) card, a MultiMedia (MMC) card, a Memory Stick card, a USB flash drive, an ExpressCard, and a flash memory hard drive.

13. The card-type electronic apparatus of claim 1, further comprising a switch protruding through one of the at least two lower sidewalls.

14. The card-type electronic apparatus of claim 1, wherein at least one of the at least two lower sidewalls includes a notch.

15. A card-type electronic apparatus comprising:
 a printed circuit board assembly (PCBA) including one or more integrated circuits (ICs) mounted on a printed circuit board (PCB), the PCBA having a width defined by opposing side edges of the PCB;
 an upper plastic cover having a planar upper surface and upper sidewalls extending perpendicularly from the planar upper surface, the upper sidewalls having respective lower ends and being separated by a first width; and
 a lower plastic cover, the lower plastic cover comprising a plurality of lower sidewalls extending substantially perpendicularly from a bottom exterior surface of the lower plastic cover, the plurality of lower sidewalls defining a pocket having a width that is wider than an external surface-to-external surface distance of said upper sidewalls, whereby when said upper plastic cover is mounted on said lower plastic cover, both said upper sidewalls are disposed between said lower sidewalls, wherein the upper plastic cover is permanently attached to the lower cover at a seam within the pocket such that the lower ends of the upper sidewalls are attached to an interior surface of said lower plastic cover inboard of said lower sidewalls, wherein the upper plastic cover and the lower plastic cover enclose the PCBA, and wherein the width of the PCBA is substantially equal to an interior width separating interior surfaces of the upper side walls, and the PCBA is mounted against an interior surface of the upper cover such that no portion of the lower plastic cover is disposed between outer edges of the PCBA and the upper side walls of the upper plastic cover.

16. The card-type electronic apparatus of claim 15, wherein the plurality of lower sidewalls completely surround the upper plastic cover.

17. The card-type electronic apparatus of claim 15, wherein the plurality of lower sidewalls partially surround the upper plastic cover.

18. The card-type electronic apparatus of claim 15, wherein the lower plastic cover includes a plurality of support structures within the pocket, the plurality of support structures being in contact with unpopulated regions of the PCBA.

19. The card-type electronic apparatus of claim 15, wherein the plurality of upper sidewalls includes a plurality of tongue features, each of the plurality of tongue features mating with one of a plurality of groove features in the lower plastic cover.

20. The card-type electronic apparatus of claim 15, wherein each of the plurality of upper sidewalls includes a step feature, each of the step features being joined to the lower plastic cover within the pocket.

21. The card-type electronic apparatus of claim 15, wherein the plurality of upper sidewalls includes at least one upper inclined surface, the at least one upper inclined surface sloping away from the upper plastic cover, wherein the plurality of lower sidewalls includes at least one lower inclined surface, the at least one lower inclined surface sloping towards the lower plastic cover, and wherein the at least one upper inclined surface is attached to the at least one lower inclined surface within the pocket.

22. The card-type electronic apparatus of claim 15, wherein each of the plurality of lower sidewalls has a top, and wherein the upper exterior surface of the upper plastic cover is above a plane defined by the tops of the plurality of lower sidewalls.

23. The card-type electronic apparatus of claim 15, wherein each of the plurality of lower sidewalls has a top, and wherein the upper exterior surface of the upper plastic cover is at or below a plane defined by the tops of the plurality of lower sidewalls.

24. The card-type electronic apparatus of claim 15, wherein the card-type electronic apparatus comprises one of a Secure Digital (SD) card, a CompactFlash (CF) card, a MultiMedia (MMC) card, a Memory Stick card, a USB flash drive, an ExpressCard, and a flash memory hard drive.

25. The card-type electronic apparatus of claim 15, further comprising a switch protruding through one of the plurality of lower sidewalls.

26. The card-type electronic apparatus of claim 15, wherein at least one of the plurality of lower sidewalls includes a notch.

\* \* \* \* \*